United States Patent
Lee et al.

(10) Patent No.: US 6,180,523 B1
(45) Date of Patent: Jan. 30, 2001

(54) COPPER METALLIZATION OF USLI BY ELECTROLESS PROCESS

(75) Inventors: Chwan-Ying Lee, Tainan; Tzuen-Hsi Huang, Tou Liu, both of (TW)

(73) Assignee: Industrial Technology Research Institute, Hsin-Chu (TW)

(*) Notice: Under 35 U.S.C. 154(b), the term of this patent shall be extended for 0 days.

(21) Appl. No.: 09/170,735

(22) Filed: Oct. 13, 1998

(51) Int. Cl.$^7$ .................. H01L 21/44; H01L 21/4763
(52) U.S. Cl. ................. 438/678; 438/644; 438/687
(58) Field of Search .................. 438/644, 678, 438/687, 642, 625, 618, 654

(56) References Cited

U.S. PATENT DOCUMENTS

| | | | |
|---|---|---|---|
| 4,152,164 | * 5/1979 | Gulla et al. | 106/1.27 |
| 4,265,943 | 5/1981 | Goldstein et al. | 427/305 |
| 4,322,457 | * 3/1982 | Baron et al. | 427/259 |
| 5,169,680 | 12/1992 | Ting et al. | 427/96 |
| 5,183,795 | 2/1993 | Ting et al. | 437/230 |
| 5,308,796 | 5/1994 | Feldman et al. | 437/200 |
| 5,562,760 | 10/1996 | Ballard et al. | 106/1.24 |
| 5,674,787 | 10/1997 | Zhao et al. | 437/230 |
| 5,801,100 | * 9/1998 | Lee et al. | 438/678 |
| 5,824,599 | * 10/1998 | Schacham-Diamand | 438/678 |
| 5,891,513 | * 4/1999 | Dubin et al. | 427/98 |

OTHER PUBLICATIONS

C.H. Ting et al. "Selective Elctroless Metal Deposition for Viattole Filling in VLSI Multilevel Interconnection Structures", J. Electrochem Soc. vol. 136, No. 2, Feb. 2, 1989, p462–466.

Lopatin et al. "Selective Electroless CoWP Deposition onto Pd–activated In–laid Cu lines", Jun. 10–12, 1997 VMIC Conf (1997 ISMIC–107/97/0219) p 219–224.

* cited by examiner

Primary Examiner—Richard Elms
Assistant Examiner—Adam Pyonin
(74) Attorney, Agent, or Firm—George O. Saile; Stephen B. Ackerman; William J. Stoffel

(57) ABSTRACT

The invention provides three embodiments for forming Cu/Au contacts and interconnects using electroless deposition. The three embodiments have different adhesion and barrier layers for the electroless Cu or Au plugs. The invention discloses a technique of utilizing electroless deposition in USLI circuits. This metalization process is an additive and selective to provide conducting layers as well as an interconnection between layers of a multilevel conductive metal semiconductor device. The first embodiment uses adhesion layers formed of Ni, Al, polysilicon or PdSi$_x$; and a barrier layer composed of Ni—B, Ni, Pd, or Co and has first and second metal plugs formed by selective Cu or Au electroless processes. The second embodiment forms adhesion layers of PdSi$_x$. The third embodiment forms adhesion layers of activated Ti or Al. Cu or Au plugs are selectively electroless deposited to form interconnects.

17 Claims, 7 Drawing Sheets

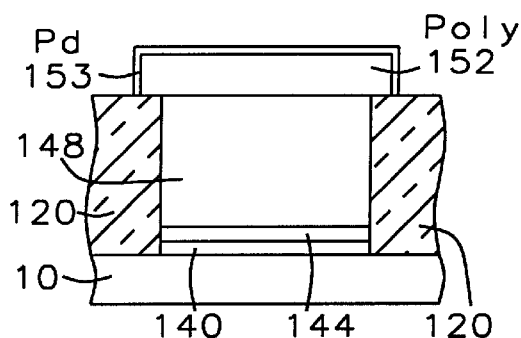 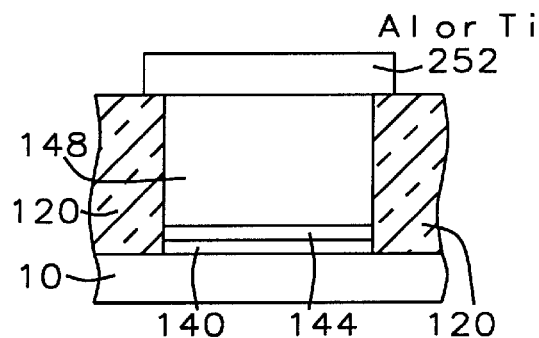
FIG. 17A    FIG. 17B
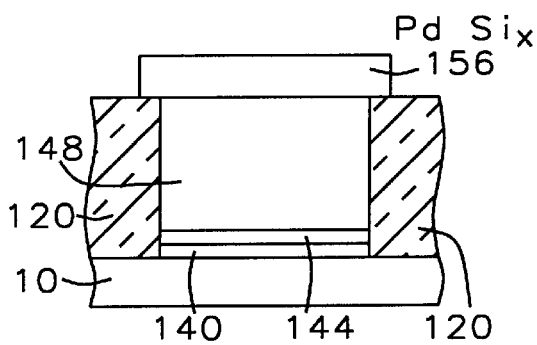 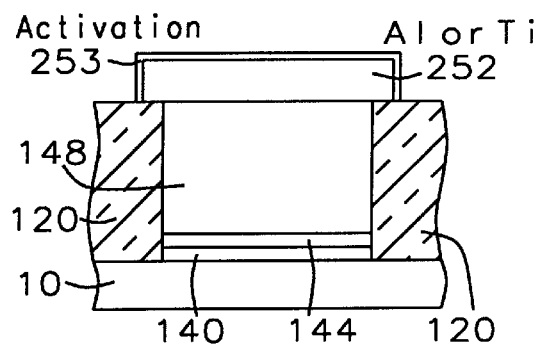
FIG. 18A    FIG. 18B

COPPER METALLIZATION OF USLI BY ELECTROLESS PROCESS

BACKGROUND OF INVENTION

1. Field of the Invention

This invention relates generally to fabrication of metal lines and interconnects in semiconductor devices, and more particularly to the fabrication of a copper or Gold metal lines and interconnect using electroless deposition.

2. Description of the Prior Art

The present invention relates to electroless plating and more particularly to the electroless plating of Cu and Ni in semiconductor wires and bumps. It also relates to the formation of high-resolution conductive wiring patterns on semiconductor and advanced packaging substrates.

3. Description of the Prior Art

Electroless plating is a method used to deposit a thin film or a layer of some material on a substrate. The principal step is the immersion of the substrate in a plating bath containing ions of the material to be deposited, causing some of these ions to precipitate at the substrate's surface. Unlike electroplating methods, electroless plating does not require an externally applied electric field to facilitate the ion deposition process. The electroless plating may be selective, i.e., the deposition may occur only at locations that exhibit appropriate electrochemical properties. For example, the ions may be deposited mainly on those portions of the substrate that are made of a material identical (or exhibiting affinity) to the material being deposited. Another of many possibilities is that portions of the substrate may be treated or activated with a catalyst to cause the ion deposition to occur at a rapid rate. The material or catalyst present in the selected areas before the deposition is sometimes referred to as "seed material" or "seed layer". The ratio of the deposition rate on the activated regions to the deposition rate at the non-activated regions is referred to as the "plating process selectivity". The deposition rate may also depend on the physical characteristics of the activated areas, e.g., their sizes, aspect ratios, and distances separating them. If the thickness of the material deposited in various locations at the substrate is similar, the plating process is said to be uniform. For many applications, it is crucial that the plating process be uniform, that it exhibit high selectivity, and that the deposited film strongly adheres to the substrate.

One of the ways to increase the adhesion is to subject the plated artifact to an annealing process. The conditions or process parameters such as the temperature, ion concentration in the plating path, and duration of the bath, which provide desirable uniformity, selectivity, and some physical properties of the deposited layer usually fall within certain ranges, the combination of which is called a "technological process window". To insure the repeatability and consistency of the plating process, it is desirable that the process window be as large as possible.

Electroless plating of solid metals from a solution containing metal ions onto a catalytically active surface has been widely used in the printed circuit board industry for production of wiring layers and inter-layer (via) connections. More recently, this body of knowledge has been applied to producing metal interconnect films in the integrated circuit (IC) industry. The electroless plating technique has several advantages over other well known metal deposition techniques such as sputtering and evaporation. One advantage is that the electroless plating process uses materials and capital equipment that are inexpensive compared to the other methods. Another advantage is that the technique deposits films only in selected, catalytically active regions. This property of selective growth allows the user to reduce the number of lithographic patterning and etching steps used to define the regions to be covered by the deposited metal. It also facilitates dense patterning of materials such as copper, that are difficult to etch anisotropically. Yet another advantage is that the growth rate of the deposited metal is relatively independent of the angles or relative heights of topographic features on the substrate being plated. This property enables deposition into features having high aspect ratios, such as deep via holes on multi-layer circuit boards, that could not be uniformly covered by the "line of sight" deposition techniques such as sputtering and evaporation.

The most commonly published use of electroless plating in the integrated circuit industry is for filling contact or via holes. The traditional contact is a hole, patterned and etched in a dielectric film placed on top of a conducting film so that the surface of the conducting film is exposed within the hole. An upper level of conductor, patterned over the contact hole, makes a physical and electrical contact with the lower conductor in the contact region. Electroless plating has been used to grow metal selectively onto the surface of the lower conductor that is exposed in the contact hole. This produces a metallic "plug" which electrically couples the upper conductor to the lower conductor. The "plug" is plated until its top surface substantially coincides with the top surface of the dielectric, and the resulting planarity of the structure prevents problems that might occur in the subsequent processing if topographic variations were present in the vicinity of the contact region.

Although electroless plating-based processes, such as contact-hole filling, offer many advantages to the process designer, the technique has only found limited acceptance within the IC manufacturing community. Although the technique appears to be relatively simple, the chemical reactions occurring at the plated surface can be complex. Some of the factors inhibiting the wider application of electroless plating are the difficulties in controlling the plating process and in obtaining uniform plating thickness on the entire substrate, as well as the sensitivity to contaminants exhibited by the process. Many of these problems are related to the previously known surface activation techniques, i.e., methods used to render the plated surface catalytically active. The present invention teaches a new surface preparation technique that provides a more active surface on which to plate, thereby improving the latitude of the plating process and the uniformity of the plated materials.

Many surface activation techniques have been reported in both the patent and scientific literature. Frequently, these techniques are designed for plating a specific material onto a specific substrate material, and rely on certain properties of these materials. The most common applications of electroless plating to integrated circuit manufacturing comprise plating of nickel, cobalt, palladium, or copper onto one of two types of substrate surfaces. The first type of substrate surface comprises conductive regions of substrates that are generally formed of silicon, aluminum, or aluminum alloys. The second type of substrate comprises a non-conductor such as silicon dioxide or a polymeric insulator. The reported surface activation techniques applied to these substrates usually fall into one of three categories: (1) catalyst film deposition by evaporation or sputtering, (2) catalyst film deposition by electrochemical surface modification, and (3) catalytic film deposition from a colloidal suspension.

Palladium and platinum are frequently used as catalytic surface activators in electroless plating methods. Catalytic films of palladium or platinum for subsequent electroless plating can be readily deposited by evaporation or sputtering techniques. The films deposited with these techniques can be patterned by well known lithographic techniques, e.g., subtractive etching or liftoff. Large features and/or dense patterns of small features are relatively easy to plate with this method.

It has been reported that the catalytic activity of palladium films deposited by evaporation and sputtering is lower than that of palladium films deposited by other techniques, for example electrochemically deposited films. This low activity has a significant detrimental impact on the uniformity of structures formed by this process and on the resulting yield. Features that are small or separated with large distances from other features are significantly more difficult to plate. These size-dependent and proximity-dependent effects are often related to the presence of stabilizing agents (stabilizers) in the plating solutions. Stabilizers are added to most commercially available plating solutions to prevent the spontaneous decomposition of the plating bath. Generally, the stabilizers reduce or even prevent the auto-catalytic plating reaction from occurring on small particles that may be present in the bath. The presence of such particles may result from a contamination of the plating bath with the airborne dust. The stabilizing agents also exert a significant and beneficial impact on the electrical and mechanical properties of the deposited film, although the mechanisms for this action are not always clearly understood. It is intuitively clear, however, that any mechanism that prevents undesirable auto-catalytic plating on small particles in the bath may also impede the desirable plating of small, isolated features present on the substrate. Plating of small features may be enhanced by modifying the bath composition or process conditions. For instance, the ability to plate sub-micrometer features can be improved by raising the plating bath temperature, or by reducing the amount of the stabilizing agents in the bath. This improvement is obtained at the price of a reduced plating selectivity and reduced bath stability.

The plating non-uniformity and process selectivity also depend on the detailed history of the catalytic surface. Subjecting this surface to any post-patterning clean-up processes or exposing it to air before plating reduce the ability to uniformity plate the desired features.

A wide range of electrochemical surface modification techniques to enable the catalytic plating on metallic and dielectric materials have been disclosed. Aluminum films used in VLSI circuits can be rendered catalytically active by electroless plating of a seed layer of palladium from a bath containing a dilute aqueous solution of $PdCl_2$ and HCl. Typically, the pre-existing aluminum oxide is removed by a short immersion in a dilute HF solution prior to the palladium activation. The degree of activation achieved by this technique depends strongly on the processing history of the aluminum surface, the concentration of the activator components, the temperature, and duration of the exposure of the aluminum surface of the activator. This method can achieve very high levels of activation, but suffers from a very small "process window". If the exposure to the activator solution is too brief, the insufficient surface activation and the resulting plating non-uniformity will occur. If the exposure to the activator solution is too long, the plated metal will exhibit poor adhesion. While this process has been demonstrated to work, the development of a stable, reproducible manufacturing implementation is difficult.

Another method of activating aluminum surfaces using the electroless deposition of zinc. The zinc is then used as a catalytic seed material for subsequent plating of the nickel film. This process is commonly refereed to as "zincating", and is extremely effective for activating larger dimension patterns but suffers from a reduced process window in the presence of features with small dimensions, such as used in many integrated circuits. The process exhibits a tradeoff between activation and adhesion similar to the one discussed above for palladium-based activation.

Conventionally, the conductor lines are formed by photolithography and dry etching of dielectric and metal layers. However, the Al—Si (or Al—Si—Cu) system does not satisfy many requirements, such as high thermal stability, low electromigration, and high corrosion resistance. Copper is a candidate for multilevel interconnection because of several properties that give it the potential advantages over Al. Unfortunately, copper is quite mobile in Si at elevated temperature and its presence in Si creates trap levels that are deleterious to device operation. For these reasons, it is necessary to determine which materials may act as effective diffusion barrier for copper migration. A suitable diffusion barrier should meet certain constrains:

a. slow transport rate of the substrate and the adjoining material across the barrier layer;

b. slow loss rate of barrier layer into the substrate and adjoining layer;

c. strong adhesion of barrier layer with substrate and with adjoining material;

d. the barrier layer should be laterally uniform in thickness and substrate;

e. the barrier layer should be thermodynamically stable against substrate and adjoining material;

f the barrier layer should have low resistivity.

Electroless copper deposition technique is especially appealing because of low cost and low process temperature, high deposition rate and high quality of electroless Cu deposit. Electroless copper process can be described by two steps which occur simultaneously on the catalytic surface: 1) anodic oxidation of reducing agents and 2) cathodic reduction of metal ions. A catalytic layer is needed for electroless copper deposition to catalyze oxidation of reducing agents and to transport electrons from anodic sites of reaction to cathodic sites of reaction. Hence we must deposit another adhesion layer on the diffusion barrier layer because the surface of diffusion barrier is not autocatalytic.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,674,787(Zhao) Selective electroless copper deposited interconnect plugs for ULSI applications—shows a method utilizing electroless copper deposition to selectively form encapsulated copper plugs to connect conductive regions on a semiconductor. A via opening in an inter-level dielectric (ILD) provides a path for connecting two conductive regions separated by the ILD. A SiN or SiON dielectric encapsulation layer is formed along the sidewalls of the via. Then, a contact displacement technique is used to form a thin activation layer of copper on a barrier metal, such as TiN, which is present as a covering layer on the underlying metal layer. After the contact displacement of copper on the barrier layer at the bottom of the via, an electroless copper deposition technique is then used to auto-catalytically deposit copper in the via. The electroless copper deposition continues until the via is almost filled, but leaving sufficient room at the top in order to form an upper encapsulation layer. The SiN or SiON sidewalls, the bottom barrier layer and the cap barrier layer function to fully encapsulate the copper plug in the via.

U.S. Pat. No. 5,308,796(Feldman ) shows a electroless Cu dep using Palladium silicide as a catalytic surface.

U.S. Pat. No. 5,169,680(Ting) shows an electroless deposition of Cu for a metallization.

U.S. Pat. No. 5,183,795(Ting) shows selective electroless deposition of Cu into an interconnect.

U.S. Pat. No. 5,562,760(Ballard et al.), U.S. Pat. No. 4,265,943(Goldstien), discuss electroless metal deposition processes.

Ting, et al., Selective Electroless metal Deposition for Via hole filling in VLSI multi-level Interconnection Structures, J. Electochem Soc. Vol 136, No. 2, Feb. 2, 1989. p. 462 to 466 discuss electroless deposition techniques.

Lopatin et al., Selective Electroless CoWP Deposition onto Pd-activated In-laid Cu lines, Jun. 10–12, 1997 VMIC Conference (1997 ISMIC—107/97/0219 © p. 219 to 224), discusses electroless deposition techniques.

SUMMARY OF THE INVENTION

It is an object of the present invention to provide a method for fabricating a copper metalization by electroless processing.

It is an object of the present invention to provide a method for forming Cu interconnects and lines using electroless deposition.

It is an object of the present invention to form the contact hole interconnection between the first metal and the Si substrate.

It is an object of the present invention to form a via interconnection between the first metal and the second metal.

To accomplish the above objectives, the present invention provides three embodiments for of forming Cu/Au contacts and interconnects using electroless deposition. The three embodiments have different adhesion and barrier layers for the electroless Cu or Au plugs. The invention discloses a technique of utilizing electroless deposition in USLI circuits. This metalization process is an additive and selective to provide conducting layers as well as an interconnection between layers of a multilevel conductive metal semiconductor device.

The first embodiment uses adhesion layers formed of Ni, Al, polysilicon and $PdSi_x$ and a barrier layer composed of Ni—B, Ni, Pd, or Co and has $1^{st}$ and $2^{nd}$ metal plugs formed by selective Cu or Au electroless processes. The first embodiment is described as follows.

A contact hole 24 is formed in an insulating layer 20 exposing a substrate 10. The contact hole is defined by sidewalls of the insulating layer.

An adhesion layer 28 is formed on the sidewalls of the insulating layer 20 and the exposed substrate 10. The adhesion layer is preferably composed of Al, Al alloys, Ni, Palladium silicide ($PdSi_x$), titanium, polysilicon, or amorphous silicon.

A first barrier layer 34 is electrolessly deposited on the adhesion layer 28. The first barrier layer is composed of Ni, Pd, Co, or alloys of Ni, Pd, and Co.

The first barrier layer is activated using a $PdCl_2$ containing solution.

A first metal 38 is selectively electrolessly plated over the first barrier layer 34 filling the contact hole 24. The first metal deposited using an electroless plating process.

The first metal layer comprised of Cu, Au and alloys of Cu or Au.

A second insulating layer 42 is formed over the first insulating layer.

The second insulating layer 42 is patterned to form a via hole 44 exposing the first metal 38.

A second barrier layer 46 is formed over the first metal 38 and the second barrier layer 46. The second barrier layer 46 composed of Ni, Pd or Co.

The second barrier metal is activated using a $PdCl_2$ containing solution.

A second metal layer is selectively electroless plated over the first metal layer filling the via hole 44. The second metal is comprised of Au or Cu.

The second and third embodiments differ from the first embodiment in the compositions of the adhesion and barrier layers.

This invention discloses selectively depositing an interconnection material (including a barrier metal) on an underlying layer which may be a conductor or nonconductor. If the underlying surface is noncatalytic, it is necessary for introduction of an activator of the underlying surface or deposition an adhesion layer on the underlying layer.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 12, 13, 14, 15, 16, 17A, 18A, 19A, 20A are cross sectional views for illustrating a second embodiment for forming contacts using electroless deposition techniques according to the present invention.

FIGS. 12, 13, 14, 15, 16, 17B, 18B, 19B, 20B are cross sectional views for illustrating a third embodiment for forming contacts using electroless deposition techniques according to the present invention.

DETAILED DESCRIPTION OF THE PREFERRED EMBODIMENTS

The present invention will be described in detail with reference to the accompanying drawings. In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

First Embodiment—Option 1—Contact To Substrate

Below is a flow chart of the first embodiment (FIGS. 1 to 9) for forming a contact using electroless deposition and forming an interconnect using electroless deposition. The $1^{st}$ embodiment has 2 options. The first option forms a contact (see FIG. 9) while the second option forms a contact and a line 38A (See FIG. 11).

Figure 1:
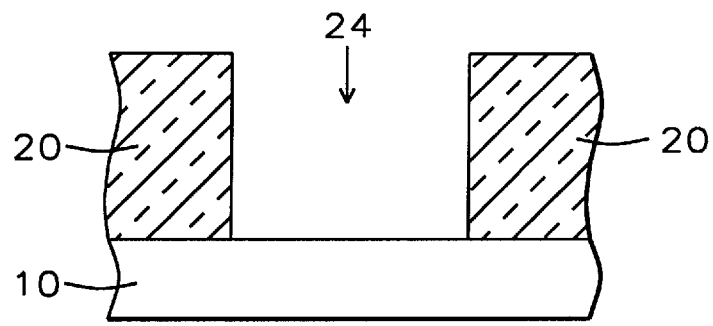
FIGS. 1 through 9 are cross sectional views for illustrating a first option for a first embodiment for forming contacts using electroless deposition techniques according to the present invention.

FIG. 1 shows the step of forming a contact hole 24 in an insulating layer exposing a substrate 10. The contact hole defined by sidewalls of the insulating layer.

The substrate 10 is preferably a semiconductor substrate composed of Silicon, GaAs, or other group III–V compounds.

Figure 2:
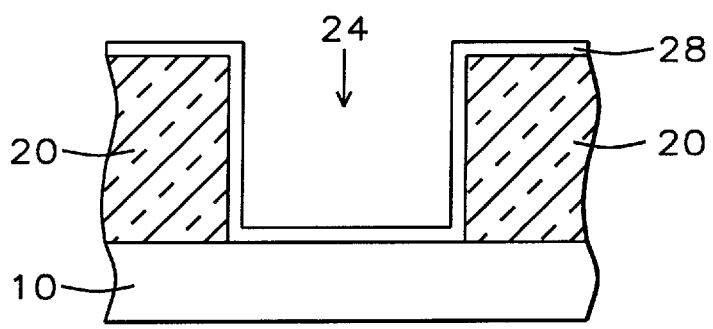
Figure 3:
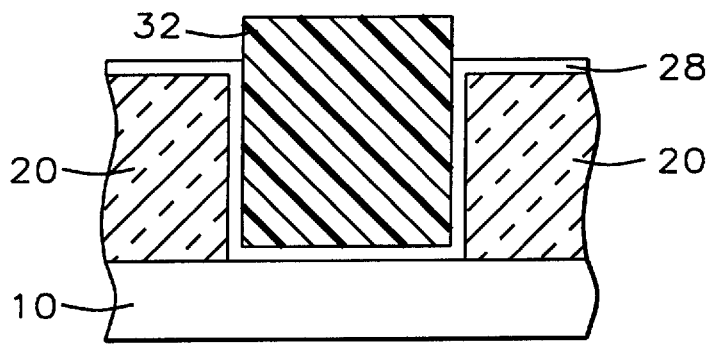
Figure 4:
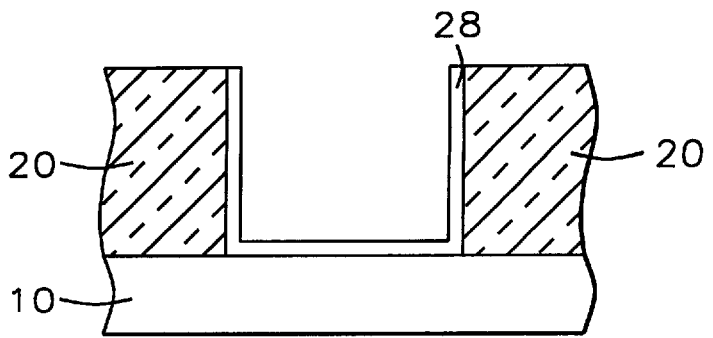

FIGS. 2, 3 & 4 show the steps of forming an first adhesion layer 28 on the sidewalls of the insulating layer 20 and the exposed substrate 10 in the contact hole. FIG. 2 shows the deposition of the adhesion layer. FIG. 3 shows a photoresist 32 used to pattern the adhesion layer. FIG. 4 shows the adhesion layer 28 patterned and the photoresist layer 32 removed.

The adhesion layer is preferably composed of Al or Al alloys, polysilicon, Ni, titanium or amorphous Silicon (A—Si). The adhesion layer is most preferably composed of Al, Al alloys or polysilicon. The adhesion layer preferably has a thickness in a range of between about 400 and 600 Å (tgt=500 Å). The adhesion layer can be formed by sputtering, evaporation and CVD processes and is most preferably formed by sputtering or CVD processes. The preferred processes for the different composition Adhesion layers are as follows: Al or Al alloys—sputter processes, Ni—sputter or electroless process, Ti—sputter process, and Polysilicon or amorphous Si—LPCVD.

TABLE 1

Summary of First embodiment - FIGS. 1 to 9

100 FIG. 1 - forming a contact hole 24 in an insulating layer 20 exposing a substrate 10; the contact hole defined by sidewalls of the insulating layer;
110 FIGS. 2 & 3 & 4 - forming an adhesion layer 28 on the sidewalls of the insulating layer 20 and the exposed substrate 10; the adhesion layer is preferably composed of: Ti, Al, Al alloys, polysilicon, Ni, Palladium Silicide ($PdSi_x$), and amorphous silicon;
120 FIG. 5 - electrolessly depositing - a first barrier layer 34 on the adhesion layer 28; the first barrier layer is composed of Ni, Pd, Co, and alloys of Ni, Pd, Co;
130 activating the first barrier layer using a $PdCl_2$ containing solution;
140 FIG. 5 - selectively electrolessly plating a first metal 38 over the first barrier layer 34 filling the contact hole 24; the first metal deposited using an electroless plating process; the first metal layer comprised of Cu, Au and alloys of Cu or Au;
150 FIG. 6 - forming a second insulating layer 42 over the first insulating layer;
160 FIG. 7 - patterning the second insulating layer 42 to form a via hole 44 exposing the first metal 38;
170 FIG. 8 - forming a second barrier layer 46 over the first metal 38; the second barrier layer 46; the second barrier layer 46 composed of Ni, Pd or Co;
180 activating the second barrier metal using a $PdCl_2$ containing solution;
190 FIG. 9 - selectively electroless plating a second metal layer over the first metal layer filling the via hole 44; the second metal comprised of Au or Cu.

TABLE

Key Elements of the first embodiment - $1^{st}$ option - FIGS. 1 to 9

| element number | layer | Preferred composition and other parameters | alternate materials/ processes |
|---|---|---|---|
| 50 | second electroless metal (metal II) | Cu | Cu or Au |
| 46 | Second Barrier layer | Ni—B | Ni, Pd or Co |
| 38 | 1st electroless metal | CU | Cu or Au |
| 34 | $1^{st}$ Barrier layer | thickness 2000 Å | Ni, Pd, Co |
| 28 | adhesion layer | Ni thickness = 500 Å | Al, Al alloys, A—Si, Poly, Ti, $Pd_2Si$ |
| 10 | substrate | Si | GaAs |

Figure 5:
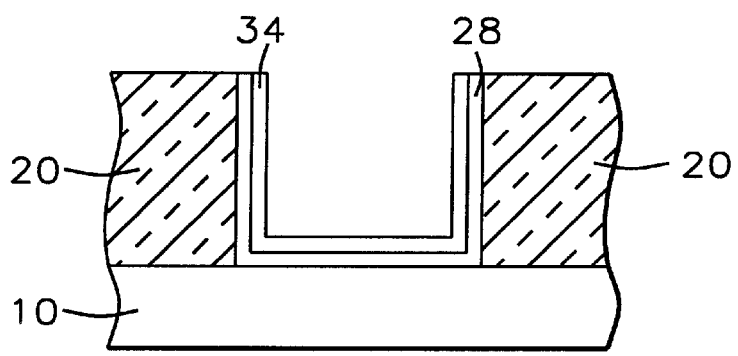

FIG. 5 shows the step of forming a first barrier layer 34 on the adhesion layer 28. The first barrier layer is preferably composed of Ni, Pd, Co or alloys of Ni, Pd, Co, but not limited to these. The barrier layer preferably has a thickness in a range of between about 1800 and 2200 Å (tgt—2000 Å). The barrier layer can be formed by sputtering, electroless plating, evaporation and chemical vapor deposition (CVD) processes and is most preferably formed by electroless plating. The barrier layer prevents the migration of metal atoms.

The barrier layer is activated before the Cu deposition by using a $PdCl_2$ containing solution.

The barrier layer 34 is formed on the bottom of the hole 24 and on the sidewalls.

TABLE composition of the electroless Ni solution

|  | Range (g/l) Low–high | Target (g/L) |
|---|---|---|
| Nickel sulfate | 28–32 | 30 |
| Dimethlyamine Borane (DMAB) | 2.8–3.2 | 3.0 |
| Sodium citrate | 25–35 | 30 |
| Ammonium Chloride | 28–32 | 30 |
| Temperature ° C. | 58–62 | 60 |
| pH Value | 5.9–6.1 | 6.01 |

TABLE

Composition of the Electroless Co solution

|  | Range g/L | Target g/l |
|---|---|---|
| Cobalt Sulphate | 19–21 | 20 |
| Sodium Hypophosphite | 10.5–11 | 10.7 |
| Sodium Citrate | 55–60 | 58 |
| Ammonium Chloride | 70–80 | 90 |
| Other conditions |  |  |
| Temperature | 88–92 | 90 |
| pH value | 6.7–7.1 | 7.0 |

TABLE the composition of the electroless Pd solution

|  | Range g/l | Target |
|---|---|---|
| Palladium chloride | 28–32 g/l | tgt = 30 g/l |
| $NaH_2PO_2$ H20 | 7.2–7.8 g/l | tgt. = 7.5 g/l |
| Sodium citrate | 5–80 g/l | tgt = 72 g/l |
| $NH_4Cl$ | 45–50 g/l | tgt = 48 g/l |
| pH value | 9.9–10.1 | tgt = 10 |

Figure 6:
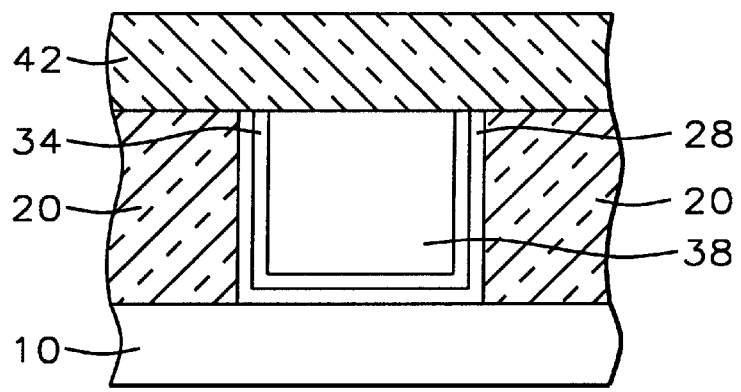

FIG. 6 shows the step of electrolessly depositing a first metal 38 over the barrier layer 34 filling the contact hole 24. The first metal is preferably Cu or Au or alloys of Cu or Au and most preferably is Cu. The preferred first metal is Au if the substrate is composed of GaAs or any other group III–V compound. The first metal is preferably deposited using a electroless Cu process. The table below describes the preferred Cu electroless solution and process.

TABLE

The composition of the electroless Cu solution

|  | Range Units g/l | Tgt = Units g/l |
|---|---|---|
| Copper Sulphate | 6–7 | 6.5 |
| Sodium citrate | 15–15.8 g/l | 15.4 |
| Nickel Sulphate | 0.4–6.0 g/l | 0.5 g/l |
| Sodium Hypophosphite | 10–11 | 10.5 |
| Boric acid | 4.5–5.5 | 5.0 |
| Temp (° C.) | 62–68 | 65 |
| pH value | 9.0–9.3 | 9.2 |

It is important to note that the electroless Cu solution contains hypophosphite ions—to replace the formaldehyde reducing agent. This is an advantage of the invention.

High aspect ratio interconnects can be filled with Cu to produce a low resistance runners by electroless deposition technique. This technique has most important advantage of selective deposition thus can eliminate the Cu dry etching process.

Below is a table with the preferred Au electroless solution and process.

TABLE

The Composition Of Electroless Au Solution

|  | Range (g/l) | Target |
|---|---|---|
| Gold potassium cyanide | 1.8–22 | 2.0 |
| Sodium Hypophosphite | 9.5–10.5 | 10 |
| Sodium citrate | 45–55 | 50 |
| Ammonium chloride | 70–80 | 75 |
| Other conditions |  |  |
| Temperature | 88–92 | 90 |
| pH value | 6.9–7.1 | 7.0 |

The inventor has found that the above Cu and Au electroless processes work unexpectedly well with the Barrier layer composed of electroless Ni, Pd, and Co describe above.

FIG. 6 shows the step of forming a second insulating layer (ILD layer) 42 over the first insulating layer. The ILD layer is preferably formed of silicon oxide.

Figure 7:
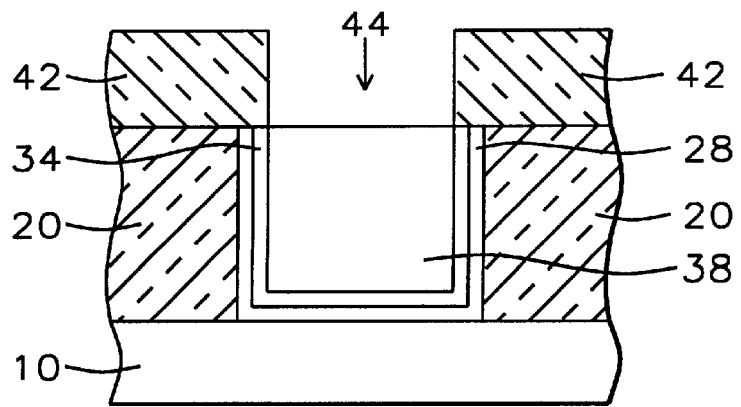

FIG. 7 shows the step of patterning the second insulating layer 42 to form a via hole 44 exposing the first metal 38.

Figure 10:
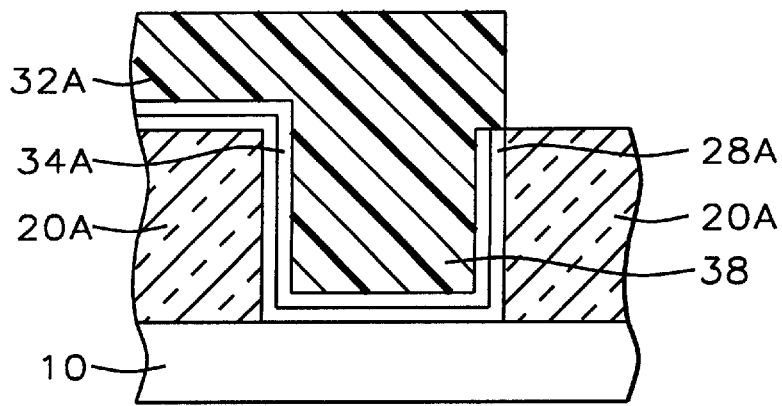
FIGS. 10 through 11 are cross sectional views for illustrating a second option of the first embodiment for forming lines and interconnects using electroless deposition techniques according to the present invention.

In an option shown in FIG. 10, the via hole is larger than the first metal 38 and exposes portions of the second insulating layer.

Next, preferably we activate the first metal 38 for electroless deposition. The activation of the first metal layer is preferably performed using a $PdCl_2$ containing solution. Other method of activation also can be used including HF containing pickling solution.

Figure 8:
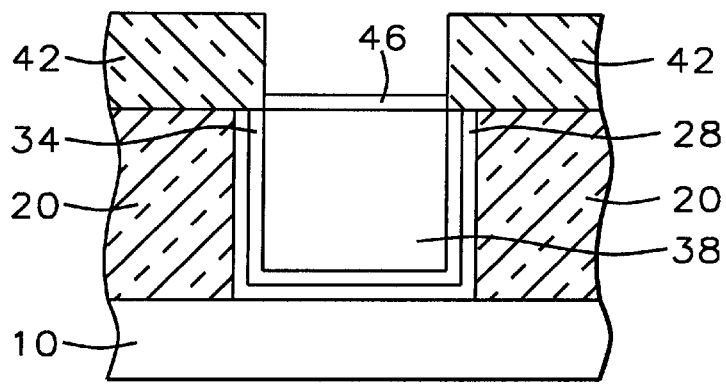

FIG. 8 shows the step of electroless plating a barrier layer 46 (i.e., second barrier metal layer) on the first metal layer 38. The barrier layer is by comprised of Ni—B, Pd or Co or Cu, Au and is most preferably composed of Ni—B. We use Ni—B to reduce the resistivity. The Ni electroless solution above is used with the addition of a B containing chemical.

Figure 9:
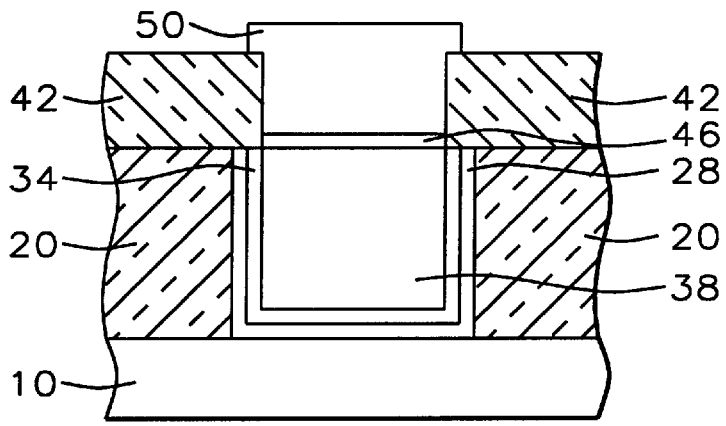

Next, as shown in FIG. 9, the second metal layer 50 is formed on the barrier layer 46 at least filling the via hole 44.

The lateral growth of the second metal can be limited and controlled by the plating time.

The second metal preferably comprising Cu or Au. The preferred process is a selective electroless deposition process. See above.

The most important steps in the 1st embodiment are shown in the table below:

TABLE important steps in 1$^{st}$ embodiment - 1$^{st}$ option - contact

| Step/layer | Figure | Reason step/layer is important |
|---|---|---|
| 120 | 4 | Adhesion and barrier layer deposition |
| 130 | FIG. 5 | Electroless Cu/Au Metal 1 deposition |
|  | FIGS. 8 & 9 | Second barrier layer 46 and metal II deposition 50 |

The 1$^{st}$ embodiment provides an electroless process for barrier metal and cu interconnection deposition. We can used these processes to make the multilevel metallization structure for VLSI circuits.

1st Embodiment—Option 2—line interconnections at metal level 1 or higher

The first embodiment has a second option that forms a metal line while forming a contact. See FIGS. 10–11.

Figure 11:
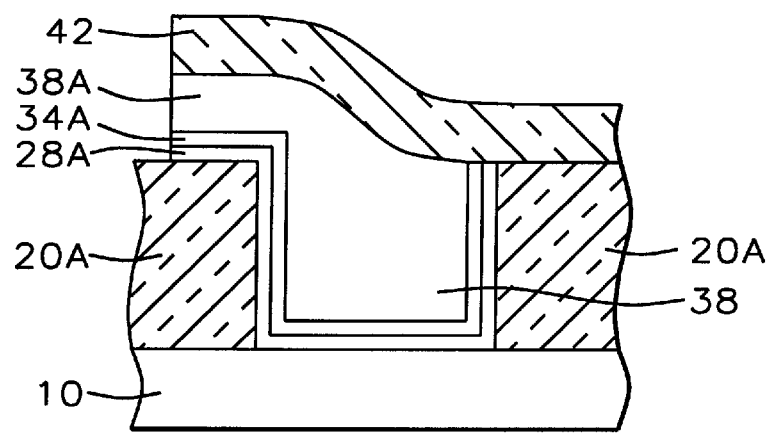

In FIG. 10, the adhesion layer 28 is formed on the top surface of the insulating layer 20A (IMD) adjacent to the Via opening. In FIGS. 10 and 11, the substrate 10 represents a contact to a silicon wafer and or an interlevel dielectric (ILD) layer.

As shown in FIG. 11, we deposit a first metal 38 over the barrier layer 34 filling the contact hole and forming a first metal line 38 on the adhesion layer 28 on the top surface of the insulating layer 20A adjacent to the contact opening. The layers can be formed using the processes described above.

The benefits of the 1st embodiment (option 2) are that it does not need a large contact hole, thus can reduce the device sized an increase the packing density.

Second Embodiment—PdSi$_x$ adhesion layer

The second embodiment shown in FIGS. 12–16, and FIGS. 17A, 18A, 19A and 20A. Below is a flow chart of the second embodiment for forming a contact using electroless deposition.

TABLE summary of the second embodiment

Figure 12:
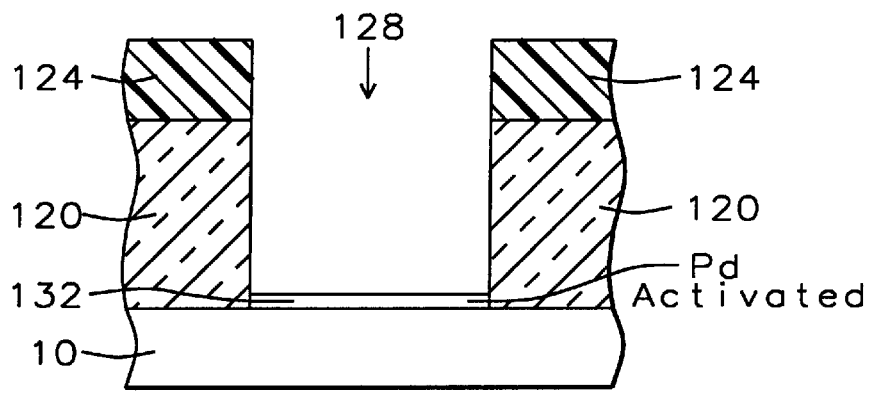
Figure 13:
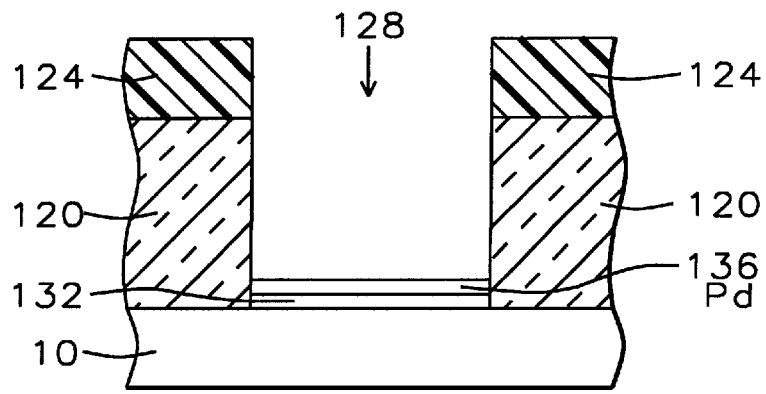
Figure 14:
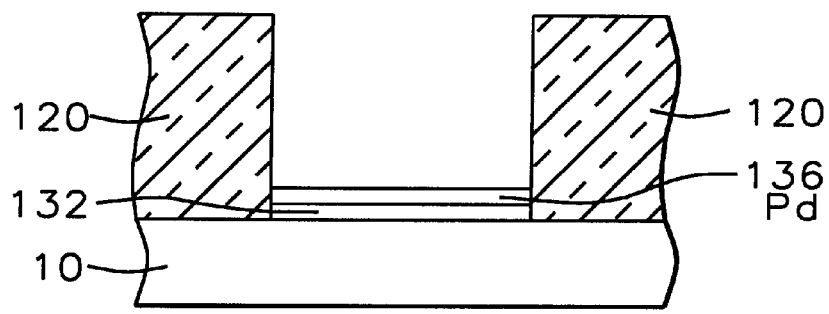
Figure 15:
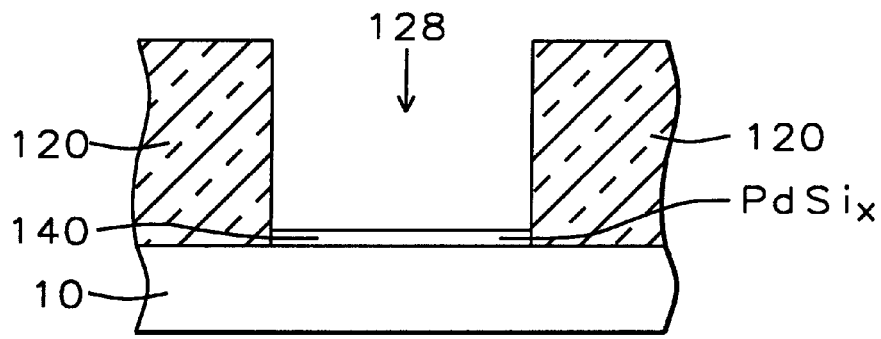
Figure 16:
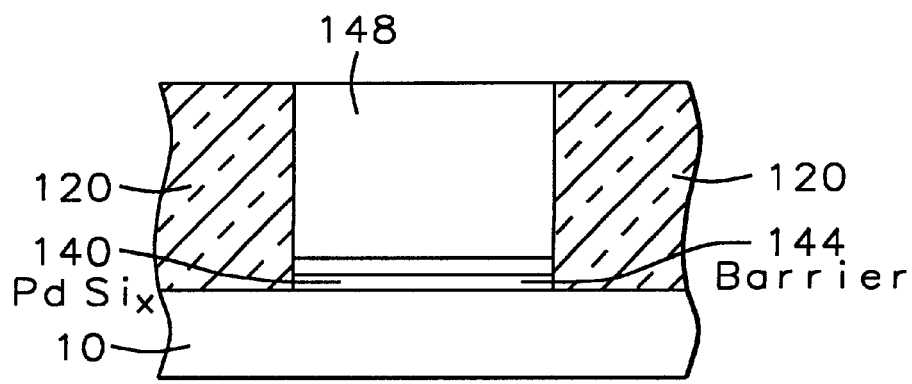
Figure 19A:
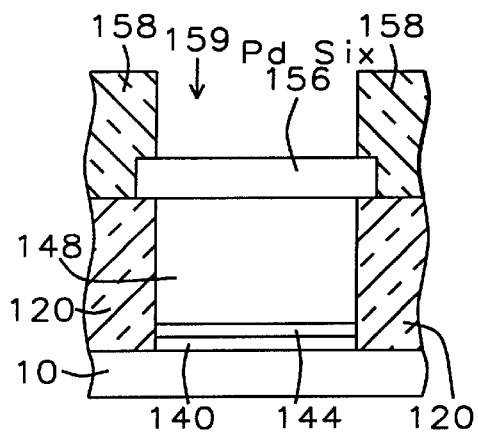
Figure 20A:
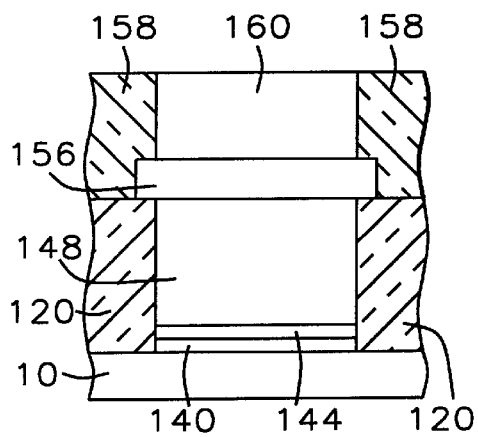

| Step | |
|---|---|
| 200 | FIG. 12 forming an insulating layer 120 over a substrate 10; |
| 210 | FIG. 13 - forming a first photoresist layer 124 having first openings over the insulating layer 120; |
| 220 | FIG. 12 - forming a contact hole 128 in the insulating layer 120 exposing a substrate 10; |
| 220 | FIGS. 12 forming a first activation layer 132 on the exposed substrate 10 in the contact hole 128; the first activation layer 132 formed using a Pd containing solution; |
| 230 | FIGS. 13 & 14 forming a Palladium (Pd) layer 136 on the first activation layer; the Palladium (Pd) layer formed by platting or sputtering processes; |
| 240 | removing the first photoresist layer; |
| 250 | FIG. 15 annealing the Palladium (Pd) layer 136 and the first activation layer forming a Pd silicide layer 140 in the contact hole on the substrate; |
| 260 | FIG. 16 - forming a barrier layer 144 over the Palladium (Pd) silicide layer 140; the barrier layer is composed of Ni, Pd, Co and alloys of Ni, Pd, Co; |
| 270 | FIG. 16 - electrolessly depositing a first metal layer filling the contact hole; 148 the first metal layer composed of Cu or Au on the barrier layer 144; |
| 280 | FIG. 17A - forming a polysilicon layer 152 over the first metal layer 148; |
| 290 | FIG. 18A - depositing a Palladium (Pd) layer 153 over the Polysilicon layer 152 using a electroless or sputtering process; |
| 292 | FIG. 18A annealing the Palladium (Pd) layer and the polysilicon layer 152 to form a Palladium silicide (PdSi$_x$) layer 156 on the first metal layer 148; |
| 294 | FIG. 19A - forming a second insulating layer 158 over the first insulating layer; the second insulating layer having a second contact hole aligned with the first contact hole 128 and exposing the Palladium silicide (PdSi$_x$) layer 156; |
| 296 | FIG. 20A - selectively electroless plating a second metal layer 160 over the first metal layer filling the second contact hole; the second metal 160 comprising Cu or Au. |

The table below shows the important elements for the second embodiment.

TABLE elements for the second embodiment

| element number | Layer | Preferred composition and other parameters | alternate materials/ processes |
|---|---|---|---|
| 160 | 2nd electroless metal | Cu or Au | |
| 156 | PdSi$_x$ | PdSi$_x$ | |
| 153 | Pd | | |
| 152 | Poly | | |
| 148 | 1st electroless metal | Cu | |
| 144 | Barrier layer | thickness 2000 Å | Ni, Pd, Co |
| 140 | PdSi$_x$ | PdSi$_x$ | Anneals layers 132 and 134 |
| 134 | Pd layer | Pd layer formed by plating or sputtering | |
| 132 | 1st Activation layer | Formed with Pd containing solution | |
| 10 | substrate | silicon | silicon (or metal line) |

The second embodiment is a method of fabrication of a contact 140 144 148 to a silicon substrate 10 using electroless deposition comprising the steps of:

FIG. 12 shows the step of forming an insulating layer 120 over a substrate 10. The insulating layer 120 is preferably formed of silicon oxide, LTO and BPSG with a total thickness between about 5000 and 7000 Å (tgt.=6000 Å).

FIG. 12 shows the step of forming a first photoresist layer 124 having first openings (contact openings) over the insulating layer 120.

Next a contact hole 128 is etched in the insulating layer 120 exposing a substrate 10. The contact hole 120 defined by sidewalls of the insulating layer.

FIGS. 12 illustrates an activated surface layer 132 preferably composed of Pd formed on the exposed substrate 10 in the contact hole 128. The activated surface layer of Pd is preferably formed immersion into the activation solution.

Referring to FIGS. 13 & 14, a Pd layer 136 is formed activated surface layer 132. The Palladium (Pd) layer is preferably formed by platting or sputtering processes. The Pd layer preferably has a thickness in a range of between about 480 and 520 Å. The Pd layer is most preferably formed using an electroless plating process.

TABLE the composition of the electroless Pd solution

|  | Range g/l | Target |
|---|---|---|
| Palladium chloride | 28–32 g/l | tgt = 30 g/l |
| $NaH_2PO_2H2O$ | 7.2–7.8 g/l | tgt = 7.5 g/l |
| Sodium citrate | 5–80 g/l | tgt = 72 g/l |
| $NH_4Cl$ | 45–50 g/l | tgt = 48 g/l |
| pH value | 9.9–10.1 | tgt = 10 |

Alternatively, the Pd layer can be formed by a sputtering process. If the Pd is sputter deposited, then the Si surface does not have to be activated as described above.

FIG. 14 shows the removal of the photoresist layer.

FIG. 15 shows the annealing of the activated surface layer 132, Palladium (Pd) layer 136 and 1st barrier layer forming a Palladium (Pd) silicide layer ($PdSi_x$) 140 in the contact hole on the substrate.

FIG. 16 shows the formation of a contact ( second) barrier layer 144 over the Pd silicide layer 140. The contact barrier layer 144 is preferably composed of Ni, Pd, Co or alloys of Ni, Pd, Co, but not limited to these. The barrier layer preferably has a thickness in a range of between about 1800 and 2200 Å (tgt—2000 Å).

FIG. 16 shows the step of electrolessly depositing a first metal layer 148 composed of Cu on the barrier layer 144.

TABLE

The composition of the electroless Cu solution

|  | Units g/l | Units g/l |
|---|---|---|
| Copper Sulphate | 6–7 | 6.5 |
| Sodium citrate | 15–5.8 g/l | 15.4 |
| Nickel Sulphate | 0.4–6.0 g/l | 0.5 g/l |
| Sodium Hypophosphite | 10–11 | 10.5 |
| Boric acid | 4.5–5.5 | 5.0 |
| Temp (° C.) | 62–68 | 65 |
| pH value | 9.0–9.3 | 9.2 |

FIG. 17A shows the forming of a (second adhesion layer) polysilicon layer 152 over the first metal layer 148. The polysilicon layer has a thickness in a range of between about 280 and 320 Å.

Referring to FIG. 18A, a Pd layer 153 is formed over the Polysilicon layer 152 using a electroless or sputtering process. The Pd layer has a thickness in a range of between about 480 and 520 Å.

As shown in FIG. 19A, the Pd layer is then annealed to form a Palladium silicide ($PdSi_x$) layer 156 on the first metal layer 148.

FIG. 19A shows the forming of a second insulating layer (ILD layer) 158 over the first insulating layer. The second insulating layer (ILD layer) has a second contact hole 159 aligned with the first contact hole 128 and exposing the Palladium silicide ($PdSi_x$) layer 156.

FIG. 20A illustrates the electroless plating of a second metal 160 over the first metal layer filling the second contact hole. The second metal 160 is preferably formed of Cu or Au.

The lateral growth of the second metal 160 over the second insulating layer can be limited and controlled by the plating time. The second metal 160 is comprised Cu or Au and most preferably Cu.

The most important steps in the 2nd embodiment are shown in the table below:

TABLE

Summary of Key points of the 2nd embodiment

| Step | figure | Reason step is important |
|---|---|---|
| 220 | 12 | Activated 136 Si surface 132, but not influenced by the oxide surface. |
| 250 | 15 | Formed $PdSi_x$ as the adhesion layer 136 |
| 296 | 20A | Metal 2 - Formed the interconnection by electroless process |

3rd Embodiment—Al or Ti adhesion layer

The $3^{rd}$ embodiment has an Al or Ti adhesion layer 252. The $3^{rd}$ embodiment is summarized in the table below:

TABLE summary of $3^{rd}$ embodiment

| | |
|---|---|
| 300 | FIG. 12 forming an insulating layer 120 over a substrate 10; |
| 310 | FIG. 13 - forming a first photoresist layer 124 having first openings (contact openings) over the insulating layer 120; |
| 320 | FIG. 12 - forming a contact hole 128 in the insulating layer 120 exposing a substrate 10; |
| 320 | FIG. 12 forming a first activation layer 132 on the exposed substrate 10 in the contact hole 128; the first activation layer 132 formed using a Pd containing solution; |
| 340 | FIGS. 13 & 14 electrolessly plating a Pd layer 136 on the first activation layer; the Palladium (Pd) layer formed by platting or sputtering processes; |
| 350 | removing the first photoresist layer; |
| 360 | FIG. 15 annealing the Palladium (Pd) layer 136 and the first activation layer forming a Pd silicide layer 140 in the contact hole on the substrate; |
| 370 | FIG. 16 - forming a barrier layer 144 over the Pd silicide layer 140; the barrier layer is composed of Ni, Pd, Co and alloys of Ni, Pd, Co; |
| 380 | FIG. 16 - electrolessly depositing a first metal layer 148 composed of Cu or Au on the barrier layer 144; |
| 390 | FIG. 17B - forming an adhesion layer 252 over the first metal layer 148; the adhesion layer composed of Al or Ti; |
| 400 | FIG. 18B - depositing an second activation layer 253 over the adhesion layer 152 using the activation layer formed using a $PdCl_2$ containing or zincate containing solution; |

TABLE-continued summary of 3rd embodiment

Figure 19B:
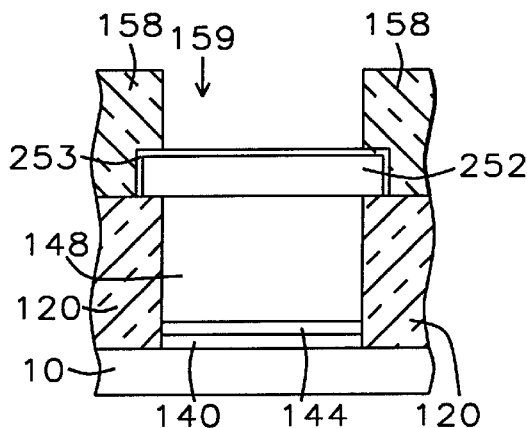
Figure 20B:
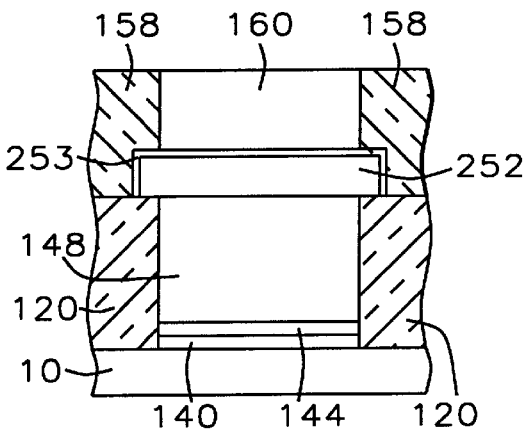

| | |
|---|---|
| 410 | FIG. 19B - forming a second insulating layer 158 over the first insulating layer; the second insulating layer having a second contact hole aligned with the first contact hole 128 and exposing the second activation layer 253; |
| 420 | FIG. 20B - electroless plating a second metal layer 160 over the first metal layer filling the second contact hole; the second metal 160 comprised of Cu or Au. |

TABLE elements for the 3rd embodiment - Option 2 FIGS. 17B to 20B

| Element number | Layer | Preferred composition and other parameters | alternate materials/ processes |
|---|---|---|---|
| 160 | 2nd electroless metal | Cu or Au | |
| 159 | Via hole | | |
| 158 | ILD layer | | |
| 253 | 2nd Activated layer - formed with a PdCl$_2$ or Zincate solution | | |
| 252 | Al or Ti adhesion layer | | |
| 148 | 1st electroless metal | Cu | Au |
| 144 | Barrier layer | Thickness ~ 2000 Å | Ni, Pd, Co |
| 140 | PdSi$_x$ | PdSi$_x$ | |
| 134 | Pd layer | Pd layer formed by plating or sputtering | |
| 132 | 1st Activation layer | Formed with Pd containing solution | |
| 10 | substrate | Silicon | Silicon (or metal line) |

The third embodiment uses the same steps as described above for the second embodiment as shown in FIGS. 12 through 16.

FIG. 17B shows the forming of a Al or Ti adhesion layer 252 (second adhesion layer) over the first metal layer 148. The adhesion layer preferably has a thickness in a range of about 500 and 1000 Å.

Referring to FIG. 18B, an activation layer 253 is formed over the adhesion layer 252 using a PdCl$_2$ or Zincate solution.

FIG. 19B shows the forming of a second insulating layer (ILD layer) 158 over the first insulating layer. The second insulating layer (ILD layer) has a second contact hole 159 aligned with the first contact hole 128 and exposing the Palladium silicide (PdSi$_x$) layer 156.

FIG. 20B illustrates the electroless plating of a second metal 160 over the second adhesion layer first metal layer filling the second contact hole. The second metal 160 is preferably formed of Cu or Au.

The lateral growth of the second metal 160 over the second insulating layer can be limited and controlled by the plating time. The second metal 160 is comprised Cu or Au and most preferably Cu.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a contact to a silicon substrate (10) using electroless deposition comprising the steps of:

a) forming a contact hole in an insulating layer exposing a substrate; said contact hole defined by sidewalls of said insulating layer;

b) forming an adhesion layer on said sidewalls of said insulating layer and said exposed substrate;
   (1) said adhesion layer is composed of a material selected from the group consisting of Al, Al alloys, polysilicon, Ni, palladium silicide, and amorphous silicon;

c) electrolessly depositing a first barrier layer on said adhesion layer;
   (1) said first barrier layer is composed of a material selected from the group consisting of Ni, Pd, Co, and alloys of Ni, Pd, Co;

d) activating said first barrier layer using a PdCl$_2$ containing solution;

e) selectively electrolessly plating a first metal over said first barrier layer filling said contact hole; said first metal deposited using an electroless plating process; said first metal layer is composed of a material selected from the group consisting Cu, Au and alloys of Cu or Au;

f) forming a second insulating layer over said first insulating layer, said first metal, said first barrier layer and said adhesion layer;

g) patterning said second insulating layer to form a via hole exposing said first metal;

h) forming a second barrier layer over said first metal; said second barrier layer composed of a material selected from the group consisting of Ni, Pd or Co;

i) activating said second barrier metal using a PdCl$_2$ containing solution; and j) selectively electroless plating a second metal over said first metal layer filling said via hole; said second metal comprised of Au or Cu.

2. The method of claim 1 wherein said adhesion layer having a thickness in a range of between about 400 and 600 Å.

3. The method of claim 1 wherein said first barrier layer is composed of electroless Nickel and having a thickness in a range of between about 1800 and 2200 Å and is formed using a electroless solution comprising: Nickel sulfate at a concentration between 28 and 32 g/l, a Dimethlyamine Borane (DMAB) at a concentration between 2.8 and 32 g/l; Sodium citrate at a concentration between about 25–35 g/l, and Ammonium Chloride at a concentration between about 28–32 g/l, at a Temperature between 58 and 62° C., and at a pH Value between 5.9 and 6.1.

4. The method of claim 1 wherein said first metal and said second metal is comprised of Cu and is formed using an electrolessly plating solution comprising: Copper Sulphate at a concentration in a range between about 6 and 7 g/L; Sodium citrate at a concentration between 15 and 15.8 g/l and Nickel Sulphate at a concentration between about 0.4 and 6.0 g/l and Sodium Hypophosphite at a concentration at a range between 10 and 11 g/L, and Boric acid with a concentration between 4.5 and 5.5 g/L; at a temp 62 and 68° C., and at a pH value between about 9.0 and 9.3.

5. The method of claim 1 which further includes
   a) said substrate comprises an interlevel dielectric (ILD) layer over a silicon wafer;
   b) and claim 1, step (b) further includes forming said adhesion layer on said top surface of said insulating layer adjacent to said contact opening; and
   c) and claim 1, step (d) further includes depositing said first metal over said barrier layer filling said contact hole and forming a first metal line on said adhesion layer on said top surface of said insulating layer adjacent to said contact opening.

6. A method of fabrication of a contact to a silicon substrate using electroless deposition comprising the steps of:
   a) forming an insulating layer over a substrate;
   b) forming a first photoresist layer having first openings over said insulating layer;
   c) forming a contact hole in said insulating layer exposing a substrate; said contact hole defined by sidewalls of said insulating layer;
   d) forming a first activation layer on said exposed substrate in said contact hole; said first activation layer formed using a Pd containing solution;
   e) forming a Palladium (Pd) layer on said first activation layer; said Palladium (Pd) layer formed by plating or sputtering processes;
   f) removing said first photoresist layer;
   g) annealing said Palladium (Pd) layer and said first activation layer forming a Pd silicide layer in said contact hole on said substrate;
   h) forming a barrier layer over said Palladium (Pd) silicide layer; said barrier layer is composed of a material selected from the group consisting of Ni, Pd, Co and alloys of Ni, Pd, Co;
   i) electrolessly depositing a first metal layer filling said contact hole; said first metal layer composed of Cu or Au on said barrier layer;
   j) forming a polysilicon layer over said first metal layer;
   k) depositing a Palladium (Pd) layer over said Polysilicon layer using a electroless or sputtering process;
   l) annealing said Palladium (Pd) layer and said polysilicon layer to form a Palladium silicide layer on said first metal layer;
   m) forming a second insulating layer over said first insulating layer; said second insulating layer having a second contact hole aligned with said first contact hole and exposing said Palladium silicide (PdSi$_x$) layer;
   n) selectively electroless plating a second metal layer over said first metal layer filling said second contact hole; said second metal comprising Cu or Au.

7. The method of claim 6 wherein said polysilicon layer thickness in a range of between about 280 and 320 Å.

8. The method of claim 6 wherein said first metal and said second metal is comprised of Cu and is formed using an electrolessly plating solution comprising: Copper Sulphate at a concentration in a range between about 6 and 7 g/L; Sodium citrate at a concentration between 15 and 15.8 g/l and Nickel Sulphate at a concentration between about 0.4 and 6.0 g/l and Sodium Hypophosphite at a concentration at a range between 10 and 11 g/L, and Boric acid with a concentration between 4.5 and 5.5 g/L; at a temp 62 and 68° C., and at a pH value between about 9.0 and 9.3.

9. A method of fabrication of a contact to a silicon substrate using electroless deposition comprising the steps of:
   a) forming an insulating layer over a substrate;
   b) forming a first photoresist layer having first openings over said insulating layer;
   c) forming a contact hole in said insulating layer exposing a substrate; said contact hole defined by sidewalls of said insulating layer;
   d) forming a first activation layer on said exposed substrate in said contact hole;
   said first activation layer formed using a Pd containing solution;
   e) electrolessly plating a Pd layer on said first activation layer; said Palladium layer formed by platting or sputtering processes;
   f) removing said first photoresist layer;
   g) annealing said Palladium (Pd) layer and said first activation layer forming a Pd silicide layer in said contact hole on said substrate;
   h) forming a barrier layer over said Pd silicide layer; said barrier layer is composed of a material selected from the group consisting of Ni, Pd, Co and alloys of Ni, Pd, Co;
   i) electrolessly depositing a first metal layer composed of Cu or Au on said barrier layer;
   j) forming an adhesion layer over said first metal layer; said adhesion layer composed of a material selected from the group consisting of Al or Ti;
   k) depositing an second activation layer over said adhesion layer using said activation layer formed using a PdCl$_2$ containing or zincate containing solution;
   l) forming a second insulating layer over said first insulating layer; said second insulating layer having a second contact hole aligned with said first contact hole and exposing said second activation layer;
   m) electroless plating a second metal layer over said first metal layer filling said second contact hole; said second metal comprised of Cu or Au.

10. The method of claim 9 wherein said barrier layer is composed of electroless Nickel and having a thickness in a range of between about 1800 and 2200 Å; and is formed using a electroless solution comprising: Nickel sulfate at a concentration between 28 and 32 g/l, a Dimethlyamine Borane (DMAB) at a concentration between 2.8 and 32 g/l; Sodium citrate at a concentration between about 25–35 g/l, and Ammonium Chloride at a concentration between about 28–32 g/l, at a Temperature between 58 and 62° C., and at a pH Value between 5.9 and 6.1.

11. The method of claim 9 wherein said first metal and said second metal is comprised of Cu and is formed using an electrolessly plating solution comprising: Copper Sulphate at a concentration in a range between about 6 and 7 g/L; Sodium citrate at a concentration between 15 and 15.8 g/l and Nickel Sulphate at a concentration between about 0.4 and 6.0 g/l and Sodium Hypophosphite at a range between 10 and 11 g/L, and Boric acid with a concentration between 4.5 and 5.5 g/L; at a temp 62 and 68° C., and at a pH value between about 9.0 and 9.3.

12. A method of fabrication of a contact to a silicon substrate (10) using electroless deposition comprising the steps of:
   a) forming a contact hole in an insulating layer exposing a substrate; said contact hole defined by sidewalls of said insulating layer;

b) forming an adhesion layer on said sidewalls of said insulating layer and said exposed substrate;
   (1) said adhesion layer is composed of a material selected from the group consisting of Al, Al alloys, polysilicon, Ni, palladium silicide, and amorphous silicon;
c) electrolessly depositing a first barrier layer on said adhesion layer;
   (1) said first barrier layer is composed of electroless Nickel and having a thickness in a range of between about 1800 and 2200 Å and is formed using a electroless solution comprising: Nickel sulfate at a concentration between 28 and 32 g/l, a Dimethlylamine Borane (DMAB) at a concentration between 2.8 and 32 g/l; Sodium citrate at a concentration between about 25–35 g/l, and Ammonium Chloride at a concentration between about 28–32 g/l, at a Temperature between 58 and 62° C., and at a pH Value between 5.9 and 6.1;
d) activating said first barrier layer using a $PdCl_2$ containing solution;
e) selectively electrolessly plating a first metal over said first barrier layer filling said contact hole; said first metal deposited using an electroless plating process; said first metal layer is composed of a material selected from the group consisting Cu, Au and alloys of Cu or Au;
f) forming a second insulating layer over said first insulating layer, said first metal, said first barrier layer and said adhesion layer;
g) patterning said second insulating layer to form a via hole exposing said first metal;
h) forming a second barrier layer over said first metal; said second barrier layer composed of a material selected from the group consisting of Ni, Pd or Co;
i) activating said second barrier metal using a $PdCl_2$ containing solution; and
j) selectively electroless plating a second metal over said first metal layer filling said via hole; said second metal comprised of Au or Cu.

13. The method of claim 12 wherein said adhesion layer having a thickness in a range of between about 400 and 600 Å.

14. The method of claim 12 wherein said first metal and said second metal is comprised of Cu and is formed using an electrolessly plating solution comprising: Copper Sulphate at a concentration in a range between about 6 and 7 g/L; Sodium citrate at a concentration between 15 and 15.8 g/l and Nickel Sulphate at a concentration between about 0.4 and 6.0 g/l and Sodium Hypophosphite at a concentration at a range between 10 and 11 g/L, and Boric acid with a concentration between 4.5 and 5.5 g/L; at a temp 62 and 68° C., and at a pH value between about 9.0 and 9.3.

15. The method of claim 12 which further includes
a) said substrate comprises an interlevel dielectric (ILD) layer over a silicon wafer;
b) and claim 1, step (b) further includes forming said adhesion layer on said top surface of said insulating layer adjacent to said contact opening; and
c) and claim 1, step (d) further includes depositing said first metal over said barrier layer filling said contact hole and forming a first metal line on said adhesion layer on said top surface of said insulating layer adjacent to said contact opening.

16. A method of fabrication of a contact to a silicon substrate (10) using electroless deposition comprising the steps of:
a) forming a contact hole in an insulating layer exposing a substrate; said contact hole defined by sidewalls of said insulating layer;
b) forming an adhesion layer on said sidewalls of said insulating layer and said exposed substrate;
   (1) said adhesion layer is composed of a material selected from the group consisting of Al, Al alloys, polysilicon, Ni, palladium silicide, and amorphous silicon;
   (2) said adhesion layer has a thickness in a range of between about 400 and 600 Å;
c) electrolessly depositing a first barrier layer on said adhesion layer;
   (1) said first barrier layer is composed of electroless Nickel and having a thickness in a range of between about 1800 and 2200 Å and is formed using a electroless solution comprising: Nickel sulfate at a concentration between 28 and 32 g/l, a Dimethlylamine Borane (DMAB) at a concentration between 2.8 and 32 g/l; Sodium citrate at a concentration between about 25–35 g/l, and Ammonium Chloride at a concentration between about 28–32 g/l, at a Temperature between 58 and 62° C., and at a pH Value between 5.9 and 6.1;
d) activating said first barrier layer using a $PdCl_2$ containing solution;
e) selectively electrolessly plating a first metal over said first barrier layer filling said contact hole; said first metal deposited using an electroless plating process; said first metal layer is composed of a material selected from the group consisting Cu, Au and alloys of Cu or Au;
   (1) said first metal is comprised of Cu and is formed using an electrolessly plating solution comprising: Copper Sulphate at a concentration in a range between about 6 and 7 g/L; Sodium citrate at a concentration between 15 and 15.8 g/l and Nickel Sulphate at a concentration between about 0.4 and 6.0 g/l and Sodium Hypophosphite at a concentration at a range between 10 and 11 g/L, and Boric acid with a concentration between 4.5 and 5.5 g/L; at a temp 62 and 68° C., and at a pH value between about 9.0 and 9.3;
f) forming a second insulating layer over said first insulating layer, said first metal, said first barrier layer and said adhesion layer;
g) patterning said second insulating layer to form a via hole exposing said first metal;
h) forming a second barrier layer over said first metal; said second barrier layer composed of a material selected from the group consisting of Ni, Pd or Co;
i) activating said second barrier metal using a $PdCl_2$ containing solution; and j) selectively electroless plating a second metal over said first metal layer filling said via hole; said second metal comprised of Au or Cu;
  (1) said first metal is comprised of Cu and is formed using an electrolessly plating solution comprising: Copper Sulphate at a concentration in a range between about 6 and 7 g/L; Sodium citrate at a concentration between 15 and 15.8 g/l and Nickel Sulphate at a concentration between about 0.4 and 6.0 g/l and Sodium Hypophosphite at a concentration at a range between 10 and 11 g/L, and Boric acid with a concentration between 4.5 and 5.5 g/L; at a temp 62 and 68° C., and at a pH value between about 9.0 and 9.3.

17. The method of claim 16 which further includes
a) said substrate comprises an interlevel dielectric (ILD) layer over a silicon wafer;
b) and claim 1, step (b) further includes forming said adhesion layer on said top surface of said insulating layer adjacent to said contact opening; and
c) and claim 1, step (d) further includes depositing said first metal over said barrier layer filling said contact hole and forming a first metal line on said adhesion layer on said top surface of said insulating layer adjacent to said contact opening.

* * * * *